Figure 1:
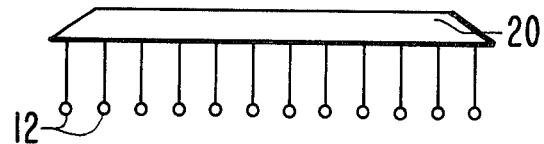

United States Patent [19]

Ipri

[11] 4,092,209
[45] May 30, 1978

[54] SILICON IMPLANTED AND BOMBARDED WITH PHOSPHORUS IONS

[75] Inventor: Alfred Charles Ipri, Princeton, N.J.

[73] Assignee: RCA Corp., New York, N.Y.

[21] Appl. No.: 755,967

[22] Filed: Dec. 30, 1976

[51] Int. Cl.² ........................................... H01L 21/306
[52] U.S. Cl. .................................. 156/628; 148/1.5;
156/643; 156/657; 252/62.3 E; 252/79.5;
427/85; 428/195
[58] Field of Search ............... 156/628, 643, 657, 659,
156/662; 252/79.4, 79.5, 62.3 R, 62.3 E;
148/1.5, 175, 187, 188, 33, 33.1, 33.3, 33.6;
428/409, 428, 538, 195; 357/53, 59, 61, 85, 91;
427/85

[56] References Cited
U.S. PATENT DOCUMENTS

| 3,738,880 | 6/1973 | Laker | 156/628 |
| 3,745,070 | 7/1973 | Yada et al. | 148/1.5 |
| 3,929,528 | 12/1975 | Davidson et al. | 48/175 |

*Primary Examiner*—William A. Powell
*Assistant Examiner*—Thomas Bokan
*Attorney, Agent, or Firm*—H. Christoffersen; D. S. Cohen; L. P. Benjamin

[57] ABSTRACT

A composition of matter produced by a process wherein silicon is bombarded by phosphorus ions and phosphorus ions are implanted therein. A method for rendering silicon substantially unetchable in a potassium hydroxide etchant by implanting phosphorus in the silicon by brombardment with phosphorus ions.

9 Claims, 8 Drawing Figures

SILICON IMPLANTED AND BOMBARDED WITH PHOSPHORUS IONS

This invention is generally related to a new composition of matter produced by ion bombardment and implantation in a semiconductor material. The invention is also related to methods for controlling the etch rate of silicon. The invention is specifically related to a method for rendering silicon inactive or chemically unetchable in potassium hydroxide using ion implantation.

It is known that doping a silicon semiconductor with boron substantially reduces the etch rate of the silicon. It is also known that the etch rate is substantially reduced either when the boron is placed in the silicon semiconductor material by solid-to-solid diffusion, gaseous diffusion or ion implantation. The etch rate of the silicon when doped with boron is known to be inversely proportional to the amount of boron doped therein. Provided the doping level is sufficiently high, the silicon is substantially unetchable in an isotropic etchant such as potassium hydroxide.

As known doping silicon with phosphorus by either gaseous diffusion or solid-to-solid diffusion does not reduce the etch rate of a silicon semiconductor body so diffused. This invention is completely inapposite to the known art and expectations.

A method is disclosed in U.S. Pat. No. 3,721,588 issued to R. G. Hays et al whereby by incorporating a P+ boron layer having a concentration of $5 \times 10^{19}$ atoms per cubic cm or greater added during the fabrication of a silicon wafer, the layer acts as an etch stop for a potassium hydroxide anisotropic etch solution. It is further disclosed in U.S. Pat. No. 3,846,198 issued to C. P. Wen et al on Nov. 5, 1974 that P+ boron layers can be used to make uniformly thin layers of single crystal silicon on an insulating sapphire substrate. The Wen et al patent is hereby incorporated by reference.

Portions of a polycrystalline silicon layer disposed on a silicon dioxide insulating layer on a semiconductor wafer may be selectively removed after diffusing boron into and through regions to be retained. This is disclosed in U.S. Pat. No. 3,738,880 entitled "A Method of Making a Semiconductor Device" by Abraham Laker, issued June 12, 1973. The Laker patent is hereby incorporatd herein by reference.

Machines for implanting ions in semiconductor materials and bombarding semiconductors with ions are known in this art. The techniques for implantation of ions into semiconductors and bombardment of semiconductors with ions vary. An example of a known ion propelling technique is exemplified in U.S. Pat. No. 3,745,070 entitled "Method of Manufacturing Semiconductor Devices", issued July 10, 1973 to Kazuo Yada et al., and this patent is incorporated herein by reference. Ion implantation is also taught by U.S. Pat. No. 3,756,861 entitled "Bipolar Transistors and Method of Manufacture", issued Sept. 4, 1973 to R. S. Pane et al. and this patent is hereby incorporated herein by reference.

The novel composition of matter is new, contrary to known teachings, and useful in the manufacture of field effect transistors comprised of silicon doped with phosphorus. The new and novel method of manufacture of the invention is the only method known for making the composition, and is useful in the manufacture of field effect transistors from silicon wherein it is necessary or desirable to anisotropically etch silicon and wherein it is useful to selectively etch silicon.

IN THE DRAWINGS

The invention may be more easily understood by referring to the drawings wherein:

FIGS. 1 through 8 illustrate steps in the process of the invention and provide illustrations of the product produced by the process.

Figure 2:
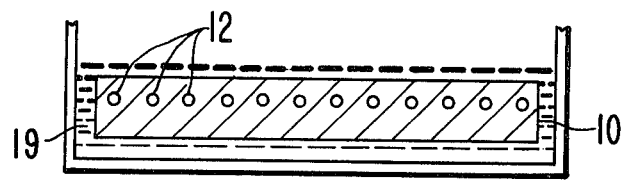

A novel and useful composition of matter 10 shown in FIG. 2 comprises a body of either polycrystalline or single crystalline silicon semiconductor which does not etch upon a subsequent exposure to an etchant. Such a species of silicon has not heretofore been known in the semiconductor art and is totally unpredicted by the prior art processes. The novel composition is produced by subjecting a body of silicon to a dose of phosphorus ions at a total concentration of $1 \times 10^{16}$ ions per $cm^2$ at an energy within a range of 30 Kev to 200 Kev and an initial exposure to potassium hydroxide.

Shown in FIG. 2 is the composition of matter 10 wherein a silicon wafer 11 has implanted therein a plurality of phosphorus ions 12. The actual depth to which the phosphorus ions 12 are implanted is not critical. The depth may range from less than one micron to several thousand microns. The important factors in the process of manufacture of this new composition are the implantation of the phosphorus ions 12 and bombardment by these ions 12 from an ion implantation acceleration apparatus (FIGS. 1, 3 and 6) such as, for example, that illustrated in U.S. Pat. No. 3,563,809 entitled "Method for Making Semiconductor Devices with Ion Beams" issued on Feb. 16, 1971, to R. G. Wilson, which patent is hereby incorporated herein by reference.

Figure 3:
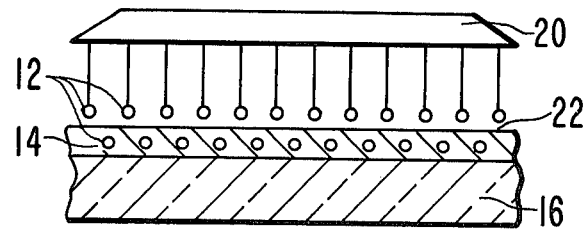

A specie of the new composition of matter which has found extensive use in the manufacture of silicon-on-insulator integrated circuits and devices is an epitaxial film 14 of single crystal or polycrystalline silicon adjacent an insulator such as sapphire or spinel. Such a specie of this novel composition of matter is illustrated in FIG. 3 as a silicon epitaxial film 14 adjacent an insulating substrate 16 comprised of sapphire, for example. The film 14 has implanted therein a plurality of phosphorus ions 12 which are approximately 0.6 microns below the exposed surface 22 of the film 14, for example. The film 14 may be typically 1.0 $\mu m$ thick, whereas the substrate 16 may be typically 500 $\mu m$ thick. The unique and novel property of the new composition of matter is the inability of a potassium hydroxide etchant 19 to appreciably etch the surface 22 of the composition (See FIGS. 2 and 4).

As the chemical structure and physical structure of the material is not known, the composition has been specified herein as a product produced by the novel process. It is believed that the combination of implanted phosphorus ions, bombardment, and the initial contact of the etchant causes the surface potential of silicon to change radically.

The novel process of the invention is illustrated in FIGS. 1 and 2 for a composition comprised of a wafer 11 of silicon. The novel process is illustrated in FIGS. 3 and 4 for a composition 14 comprised of silicon adjacent an insulating substrate 16 and in FIGS. 5–9 for selective treatment and removal of portions of the silicon adjacent the substrate 16.

The novel composition shown in FIG. 2 is produced by bombarding a silicon semiconductor wafer 11 with phosphorus ions 12 emitted from an ion machine 20 shown in FIG. 1. The semiconductor wafer 11 is undoped single crystalline silicon having a thickness, for example, of approximately 20,000 to 30,000 μm.

One necessary step for manufacture of the new composition of matter is shown in FIG. 3. There the epitaxial film 14 is adjacent the sapphire substrate 16 and phosphorus ions 12 are shown being propelled into the film 14 from an ion implantation machine 20. These phosphorus ions 12 bombard the surface 22 of the silicon film 14 and are implanted into the film 14 to an arbitrary depth. The arbitrary depth is directly related to the kinetic energy of the phosphorus ions 12.

Figure 4:
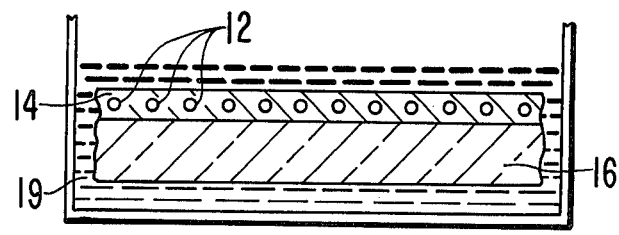
Figure 5:
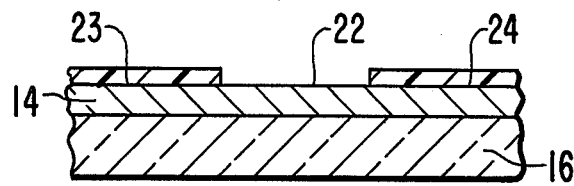
Figure 6:
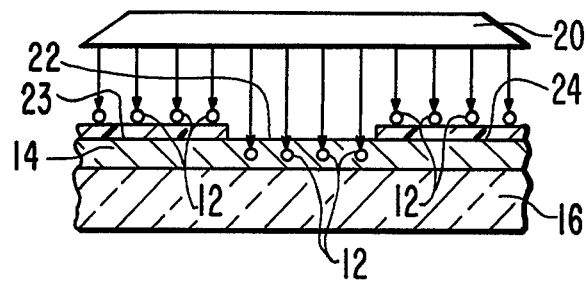

The composition shown in FIG. 4 consisting of the epitaxial film 14 with phosphorus ions 18 implanted therein adjacent a sapphire substrate 16, for example, may be used to manufacture silicon islands adjacent the substrate 16 by selectively forming the composition of matter adjacent the substrate 16. Portions of the silicon substrate 14 which are not transformed by the process of the invention to the new composition are chemically etchable in a potassium hydroxide etchant and may be removed leaving islands of the new composition of matter 14. This may be accomplished either by selectively ion bombarding and implanting phosphorus, as shown in FIG. 3, or by selectively masking certain areas 23 and 24 of the layer 14 as shown by FIG. 5, prior to the ion implantation of phosphorus (FIG. 6) such that a selected portion 28 of the layer 14 is bombarded and implanted and transformed into the new composition.

Figure 7:
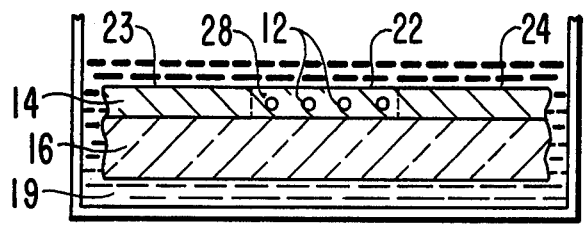

FIG. 7 shows the new composition portion 28 with the surface 22 exposed to the etchant 19. The layer 14 below surfaces 23 and 24 is removed by the etchant 19. Shown in FIG. 8 is the result of the etching step: a specie of the aforedescribed composition of matter comprising an island 29 of silicon with the implanted phosphorus ions 12 adjacent the substrate 16, the island 29 having been exposed specifically to the anisotropic etchant potassium hydroxide.

The novel composition of matter is produced by bombarding silicon with phosphorus ions to implant phosphorus to a concentration of at least $1 \times 10^{16}$ atoms per $cm^2$. This renders the silicon substantially unetchable in an etch bath comprised of 1,050 milliliters of water, 320 grams of potassium hydroxide, and 320 milliliters of n-propanol. With the etch bath at 75° C, the etch rate of both polycrystalline and single crystalline silicon in such an etch bath was discovered to be less than 0.01 micrometers per minute.

An implantation of phosphorus ions to a concentration of $5 \times 10^{15}$ ions per $cm^2$ at 150 Kev to a depth of 0.6 micrometers resulted in an etch rate in the above-specified etch bath, also at 75° C, of 0.2 micrometers per minute.

Figure 8:
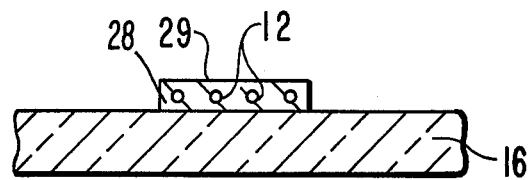

The substrate 16 shown in FIG. 8 may be a gate insulator and used to support a polycrystalline gate of phosphorus doped silicon made of the selected portion 28. This may be accomplished by selectively producing the portion 28 in specified areas on the gate insulator. Methods for selectively treating the portion 28 of silicon may either be by selective ion implantation of the phosphorus ions 12 or by selectively masking a polycrystalline silicon layer such as the film 14 such that the portion 28 is produced only in selected areas. By subjecting a composition so treated to the potassium hydroxide etchant 19 such as shown in FIGS. 2 or 7, those portions not treated are etched at a substantial rate by the bath causing a gate to appear and thereby produce polycrystalline gates on the gate insulator, for example. The invention is therefore useful in the manufacture of insulated polycrystalline silicon gates for complementary field effect transistors such as illustrated in U.S. Pat. No. 3,749,614 entitled "Fabrication of Semiconductor Devices" issued to E. J. Boleky III and J. H. Scott, Jr., July 31, 1973. The Boleky et al patent is incorporated herein by reference.

The composition of matter of the invention may also be used to manufacture devices such as shown in U.S. Pat. No. 3,745,072 entitled "Semiconductor Device Fabrication" issued to J. H. Scott, Jr. on July 10, 1973 and this patent is hereby incorporated herein by reference.

What is claimed is:

1. A body of silicon having at least a portion of a surface thereof substantially unetchable by a potassium hydroxide etchant wherein said surface portion contains therein phosphorus ions in the amount of at least $1 \times 10^{16}$ ions per square centimeter which have been implanted in the body by bombarding said surface with the ions at a kinetic energy sufficient to implant the ions into the body.

2. The body of silicon of claim 1, wherein the silicon is a single crystal.

3. The body of silicon of claim 1, wherein the silicon is polycrystalline.

4. A method for rendering a surface of silicon substantially unetchable by an anisotropic etchant comprising the steps of bombarding the silicon surface with at least approximately $1 \times 10^{16}$ ions per square centimeter of phosphor ions at a kinetic energy such as to implant said ions into the silicon below said surface.

5. The method of claim 4, further comprising the step of selectively masking said surface prior to said bombardment so that the phosphorus ions are implanted into only the unmasked portions of the surface.

6. The method of claim 5, wherein the preselected kinetic energy is selected from the range 30 Kev to 200 Kev.

7. The method of claim 5 further comprising the step of selectively removing silicon surrounding the implanted silicon surface by the step of exposing said surface to said etchant.

8. The method of claim 7 wherein the etchant is a potassium hydroxide etchant.

9. The method of claim 8 wherein the etchant comprises 320 grams of potassium hydroxide, 320 milliliters of N-propanol and 1050 milliliters of water.

* * * * *